US011075258B2

(12) United States Patent
Liu et al.

(10) Patent No.: US 11,075,258 B2
(45) Date of Patent: Jul. 27, 2021

(54) DISPLAY SUBSTRATE, MANUFACTURING METHOD THEREOF, CORRESPONDING DISPLAY PANEL AND ENCAPSULATION METHOD FOR THE SAME

(71) Applicants: Ordos Yuansheng Optoelectronics Co., Ltd., Inner Mongolia (CN); BOE Technology Group Co., Ltd., Beijing (CN)

(72) Inventors: Liangliang Liu, Beijing (CN); Feng Kang, Beijing (CN); Nini Bai, Beijing (CN); Qi Liu, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 161 days.

(21) Appl. No.: 16/346,355

(22) PCT Filed: Oct. 18, 2018

(86) PCT No.: PCT/CN2018/110760
§ 371 (c)(1),
(2) Date: Apr. 30, 2019

(87) PCT Pub. No.: WO2019/100874
PCT Pub. Date: May 31, 2019

(65) Prior Publication Data
US 2020/0343327 A1 Oct. 29, 2020

(30) Foreign Application Priority Data
Nov. 27, 2017 (CN) .......................... 201711202350.6

(51) Int. Cl.
*H01L 27/32* (2006.01)
*H01L 51/52* (2006.01)
(Continued)

(52) U.S. Cl.
CPC ...... *H01L 27/3276* (2013.01); *H01L 51/5246* (2013.01); *H01L 51/56* (2013.01);
(Continued)

(58) Field of Classification Search
CPC ............. H01L 27/3276; H01L 27/3288; H01L 27/3297; H01L 27/3244; H01L 51/5246;
(Continued)

(56) References Cited

U.S. PATENT DOCUMENTS

2016/0329523 A1* 11/2016 Kim ....................... H01L 51/525
2017/0062535 A1* 3/2017 Kim ..................... H01L 27/3246
(Continued)

*Primary Examiner* — David A Zarneke
(74) *Attorney, Agent, or Firm* — Myers Bigel, P.A.

(57) ABSTRACT

The present disclosure relates to the field of display technologies, and provides a display substrate, a manufacturing method thereof, a corresponding display panel and an encapsulation method for the same. The display substrate includes a base plate comprising a display area and an encapsulation area surrounding the display area, and an insulating layer and a plurality of wires located on the base plate. The insulating layer comprises at least one groove in the encapsulation area. At least one of the plurality of wires comprises a first portion in the display area and a second portion within a corresponding groove of the encapsulation area. There is only one said second portion present in each groove.

20 Claims, 5 Drawing Sheets

(51) Int. Cl.
  *H01L 51/56* (2006.01)
  *H01L 33/38* (2010.01)
  *H01L 33/54* (2010.01)

(52) U.S. Cl.
  CPC ........ *H01L 27/3288* (2013.01); *H01L 33/387* (2013.01); *H01L 33/54* (2013.01); *H01L 2227/323* (2013.01)

(58) Field of Classification Search
  CPC ... H01L 51/5237; H01L 33/36; H01L 33/387; H01L 33/54
  See application file for complete search history.

(56) References Cited

U.S. PATENT DOCUMENTS

| | | | |
|---|---|---|---|
| 2019/0245158 A1* | 8/2019 | Song | .................. H01L 51/5246 |
| 2020/0125202 A1* | 4/2020 | Li | ........................... H01L 51/56 |

\* cited by examiner

DISPLAY SUBSTRATE, MANUFACTURING METHOD THEREOF, CORRESPONDING DISPLAY PANEL AND ENCAPSULATION METHOD FOR THE SAME

CROSS REFERENCE TO RELATED APPLICATION(S)

The present application is a 35 U.S.C. national stage application of PCT International Application No. PCT/CN2018/110760, filed Oct. 18, 2018, which claims the benefit of Chinese Patent Application No. 201711202350.6 filed Nov. 27, 2017, the contents of which are incorporated herein by reference in their entirety.

TECHNICAL FIELD

The present disclosure relates to the field of display technologies, and in particular to a display substrate, a manufacturing method thereof, a corresponding display panel and an encapsulation method for the same.

BACKGROUND ART

Organic Light Emitting Diode (OLED) display devices are widely applied due to their characteristics such as self-luminosity, low drive voltage, fast response and so on. Since organic light-emitting materials used in the OLED display devices are very sensitive to vapor and oxygen, the encapsulation is crucial to the OLED display devices.

Conventionally, an encapsulation procedure is accomplished by laser-sintering glass frit encapsulation (which is also called Frit encapsulation). When encapsulation is performed by a Frit encapsulation process, the encapsulation sealant between a display substrate and a display cover plate needs to be sintered at a high temperature by using laser, so as to achieve sealing between the display substrate and the display cover plate, thus ensuring that the organic light-emitting materials in the display substrate can work in a vapor-free and oxygen-free environment.

However, during the high-temperature sintering by laser, metal wires on the display substrate may be melted as a result of the high sintering temperature. When brought into contact with adjacent metal wires, the melted metal wires may cause short circuits and thus give rise to display defects.

SUMMARY

According to an aspect of the present disclosure, a display substrate is provided. The display substrate comprises: a base plate, the base plate comprising a display area and an encapsulation area surrounding the display area; and an insulating layer and a plurality of wires both located on the base plate. The insulating layer comprises at least one groove located in the encapsulation area. At least one of the plurality of wires comprises a first portion located in the display area and a second portion located within the at least one groove of the encapsulation area. There is only one second portion with each of the at least one groove.

According to a specific implementation, in the display substrate provided by an embodiment of the present disclosure, each of the plurality of wires comprises a first portion located in the display area and a second portion located within the at least one groove of the encapsulation area.

According to a specific implementation, in the display substrate provided by an embodiment of the present disclosure, a width of each groove increases as a line width of the second portion of a corresponding wire increases, and a pitch between two adjacent grooves increases as a pitch between the second portions of two corresponding wires increases, wherein a width direction of each groove is parallel to a line width direction of the second portion of a corresponding wire.

According to a specific implementation, in the display substrate provided by an embodiment of the present disclosure, the insulating layer comprises at least one insulating block in the encapsulation area, with each insulation block located between two adjacent grooves.

According to a specific implementation, in the display substrate provided by an embodiment of the present disclosure, each groove comprises a bottom wall close to the base plate and two side walls intersecting with the bottom wall and in no contact with the second portion of a corresponding wire.

According to a specific implementation, in the display substrate provided by an embodiment of the present disclosure, each of the at least one groove at least partially or completely penetrates through the insulating layer.

According to a specific implementation, in the display substrate provided by an embodiment of the present disclosure, a depth of each groove is greater than a thickness of the second portion of a corresponding wire, wherein a depth direction of the groove and a thickness direction of the second portion of the corresponding wire are both perpendicular to an extension plane of the base plate.

According to a specific implementation, in the display substrate provided by an embodiment of the present disclosure, a width of each groove is greater than a line width of the second portion of a corresponding wire, wherein a width direction of the groove is parallel to a line width direction of the second portion of the corresponding wire.

According to a specific implementation, in the display substrate provided by an embodiment of the present disclosure, each groove comprises two side walls in no contact with the second portion of a corresponding wire, wherein each side wall is spaced from the second portion of the corresponding wire by a pitch greater than or equal to 1 µm in a width direction of the groove.

According to a specific implementation, in the display substrate provided by an embodiment of the present disclosure, a width of each insulating block is greater than or equal to 3 µm, wherein a width direction of the insulating block is parallel to a width direction of the groove.

According to a specific implementation, in the display substrate provided by an embodiment of the present disclosure, at least the second portion of each wire comprises a plurality of conductive layers stacked over each other, wherein two adjacent conductive layers are made of different conductive materials.

According to another aspect of the present disclosure, a manufacturing method for a display substrate is further provided. The manufacturing method comprises steps of: providing a base plate, the base plate comprising a display area and an encapsulation area surrounding the display area; and forming an insulating layer and a plurality of wires on the base plate. Specifically, the insulating layer is formed to comprise at least one groove located in the encapsulation area; at least one of the plurality of wires is formed to comprise a first portion located in the display area and a second portion located within a corresponding groove of the encapsulation area; and there is only one said second portion formed in each groove.

According to a specific implementation, in the manufacturing method for a display substrate provided by an embodiment of the present disclosure, each of the plurality of wires is formed to comprise a first portion located in the display area and a second portion located within a corresponding groove of the encapsulation area.

According to a specific implementation, in the manufacturing method for a display substrate provided by an embodiment of the present disclosure, the insulating layer comprises an interlayer dielectric layer. In this case, the method further comprises steps of: forming an active layer on a side of the interlayer dielectric layer close to the base plate and in the display area of the base plate; forming a contact via hole by using a contact hole mask in a portion of the interlayer dielectric layer located in the display area of the base plate; and continuing to form a source-drain electrode on the base plate on which the interlayer dielectric layer has been formed.

According to yet another aspect of the present disclosure, an encapsulation method for a display panel is further provided. The encapsulation method comprises steps of: providing the display substrate according to any of the preceding embodiments; providing an encapsulation cover plate, the encapsulation cover plate having an encapsulation area corresponding to the encapsulation area of the display substrate; forming an encapsulation sealant in the encapsulation area of the encapsulation cover plate; aligning the display substrate onto the encapsulation cover plate with the two encapsulation areas flush with each other; and irradiating the encapsulation sealant by laser to complete encapsulation.

According to still another aspect of the present disclosure, a display panel is further provided. The display panel comprises: an encapsulation cover plate; and a display substrate according to any of the preceding embodiments, wherein the display substrate and the encapsulation cover plate are sealed together by an encapsulation sealant.

BRIEF DESCRIPTION OF DRAWINGS

In order to illustrate the technical solutions of embodiments of the present disclosure more clearly, drawings to be used in the depiction of embodiments will be briefly introduced as follows. Apparently, the drawings in the depiction below are only some embodiments of the present disclosure. For a person having ordinary skills in the art, other embodiments can also be obtained from these drawings without any inventive efforts.

DETAILED DESCRIPTION OF EMBODIMENTS

To render goals, technical solutions and advantages of the present disclosure clearer, embodiments of the present disclosure will be further described in detail with reference to the drawings.

In related art, the display area of the display substrate can comprise a plurality of pixel units arranged in an array, wherein each pixel unit can further comprise a drive transistor and an OLED device. Besides, the display substrate can be further provided with a plurality of wires, wherein an input terminal of each wire can be connected with a drive chip located beyond the display substrate, and an output terminal of each wire can be connected with a drive transistor in a corresponding pixel unit, for providing a drive signal to the drive transistor. Since each wire needs to be connected with the drive chip beyond the display substrate, a portion of each wire will be located within an encapsulation area of the display substrate. Typically, during encapsulation of the display substrate by a Frit encapsulation process, the sintering temperature can reach 600□ or even higher. Moreover, wires in the display substrate are mainly made of aluminum (the melting point of which is 660□). Therefore, during the Frit encapsulation process, wires in the display substrate may also be melted and cause short circuits with adjacent wires. Short circuits between the wires may give rise to display defects, vertical line (also called X Line) defects or transversal line (also called Y line) defects and so on.

Figure 1:
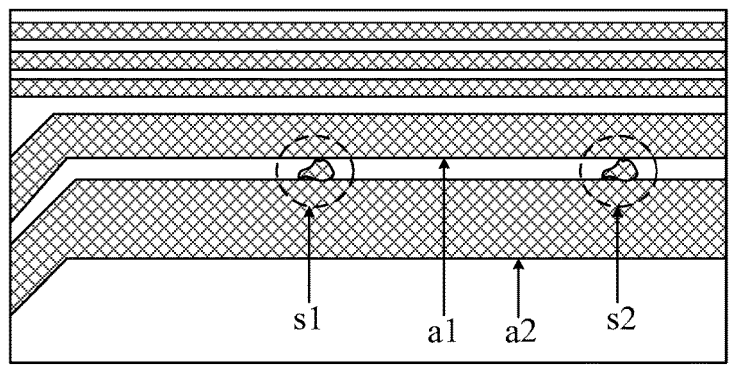
FIG. 1 is a schematic view of a short circuit occurring between adjacent wires in a display substrate according to related art.

Exemplarily, as shown in FIG. 1, in the display substrate, wire a1 is adjacent to wire a2. When wire a1 is melted, the melting liquid will flow towards the adjacent wire a2, which results in a short circuit between wire a1 and wire a2, and thus causes display defects. For example, in the schematic view as shown by FIG. 1, there can be two short circuit points between wire a1 and wire a2, i.e., s1 and s2.

Figure 2:
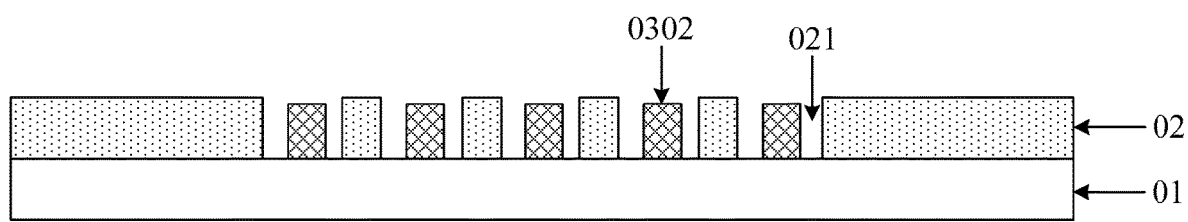
FIG. 2 is a section view of a display substrate according to an embodiment of the present disclosure.

FIG. 2 is a section view of a display substrate according to an embodiment of the present disclosure. As shown in FIG. 2, the display substrate comprises: a base plate 01; and an insulating layer 02 and a plurality of wires 03 arranged on the base plate 01.

Figure 3:
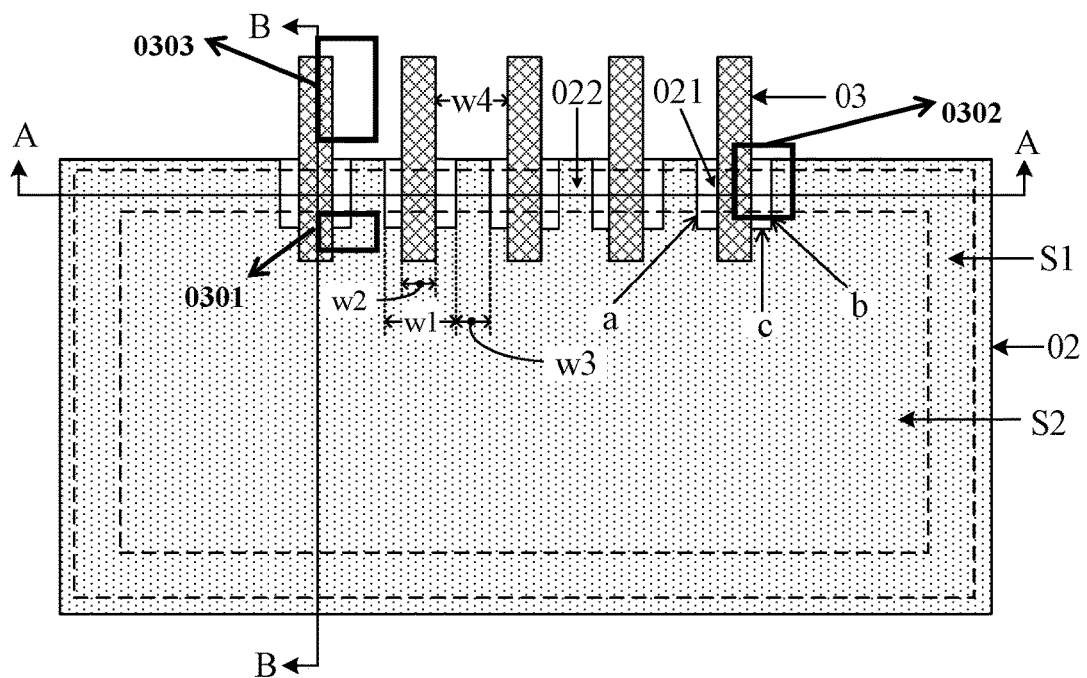
FIG. 3 is a plan view of a display substrate according to an embodiment of the present disclosure.

FIG. 3 is a plan view of a display substrate according to an embodiment of the present disclosure, and FIG. 2 is a section view taken along the direction AA in FIG. 3. As shown in FIG. 3, the base plate 01 can comprise a display area S2 located in the center and an encapsulation area S1 surrounding the display area S2. Furthermore, referring to FIG. 3, the insulating layer 02 located on the base plate 01 can comprise at least one groove 021 located in the encapsulation area S1 of the base plate 01, for example, five grooves shown in FIG. 3 as an example. Besides, each groove 021 corresponds to one of the plurality of wires 03 in a one-to-one manner. As shown in FIG. 3, each wire 03 can comprise a first portion 0301 located in the display area S2 and a second portion 0302 located in the encapsulation area. Furthermore optionally, each wire 03 can also comprise a third portion 0303 located beyond the entire base plate 01. For each wire 03 in FIG. 3, the second portion 0302 located within the encapsulation area S1 can be arranged within a corresponding groove 021. In this case, adjacent wires 03 can be isolated from each other by means of the grooves 021.

Besides, it should be pointed out that although FIG. 3 shows one groove 021 for each wire 03, and the wire 03 comprises a second portion 0302 located within the corresponding groove 021, this does not mean to limit the present disclosure at all. In fact, in an embodiment of the present disclosure, there can be other wires 03 that may possibly have a second portion 0302 located in the encapsulation area S1, but the second portion 0302 is not necessarily arranged within a corresponding groove 021.

Besides, it should be further noted that although a third portion 0303 of each wire 03 located beyond the base plate 01 is shown in FIG. 3 as an example, this does not mean to limit the present disclosure at all. In fact, according to other optional embodiments, one or more of the wires 03 may not include such a third portion 0303. This means that the wires 03 are electrically connected with an external unit via an end surface thereof at an edge of the base plate 01. Those skilled in the art should easily understand in this regard.

Furthermore, in the depiction herein, the encapsulation area S1 can refer to the following regions: during encapsulation between the display substrate and the encapsulation cover plate by means of an encapsulation sealant, orthogonal projections on the base plate of regions of film layers of the display substrate where they are in contact with the encapsulation sealant. As can be seen from FIG. 3, the encapsulation area S1 can be a region of homocentric squares located on periphery of the base plate. As an example, the plurality of wires 03 can be wires for providing a drive signal to a drive transistor on the base plate, and an input terminal of each wire can be connected with a drive chip located beyond the base plate. Exemplarily, each wire can be any of a gate line, a data line, a common electrode line and a power signal line.

It should be noted that if there are wires having a higher melting point and a lower risk of melting short circuits among the plurality of wires in the display substrate that need to pass through the encapsulation area S1 and connect with an external chip, the second portions of such wires do not have to be arranged in the grooves. In other words, each groove can correspond to a wire having a higher risk of melting short circuit among a plurality of wires in a one-to-one manner, and the wire having a higher risk of melting short circuit can comprise a second portion arranged within a corresponding groove.

To sum up, embodiments of the present disclosure provide a display substrate. Specifically, the insulating layer in the display substrate comprises at least one groove located in the encapsulation area. Besides, at least one wire in the display substrate comprises a second portion located within a corresponding groove of the encapsulation area. In this way, adjacent wires can be isolated from each other by means of grooves. In this case, even if a certain wire located in a groove is melted due to high temperature during encapsulation, it will not cause short circuits with other adjacent wires. Accordingly, the probability of display defects is effectively reduced.

Optionally, as shown in FIG. 2 and FIG. 3, each groove 021 of the insulating layer 02 in the encapsulation area S1 corresponds uniquely to a second portion of one of the plurality of wires 03, i.e., the grooves 021 correspond to the wires 03 (and their second portions) in a one-to-one manner. This means that, among the plurality of wires 03, each wire 03 comprises a second portion located in a corresponding groove in the encapsulation area. In other words, among the plurality of wires in the display substrate that need to pass through the encapsulation area and connect with an external chip, each wire can comprise a second portion arranged in a corresponding groove, which can effectively reduce the risk of short circuits between the wires.

Furthermore, according to an embodiment of the present disclosure, among the plurality of grooves 021, a width w1 of each groove can be positively correlated to a line width w2 of the second portion of a corresponding wire. In other words, for any two grooves, if the line width of the second portion of a wire located in the first groove is greater than the line width of the second portion of a wire located in the second groove, the width of the first groove can be greater than the width of the second groove correspondingly.

Moreover, a pitch w3 between any two adjacent grooves can be positively correlated to a pitch w4 between the second portions of two corresponding wires. In other words, the smaller the pitch between two adjacent wires (specifically the second portions thereof) is, the smaller the pitch between the two grooves corresponding respectively to the two wires is. Oppositely, the greater the pitch between two adjacent wires (specifically the second portions thereof) is, the greater the pitch between the two grooves corresponding respectively to the two wires is. This means that the higher the density of the wires in the display substrate is, the smaller the pitch between the adjacent grooves is.

It should be noted herein that in depictions of the present disclosure, the width direction of each groove can be parallel to the line width direction of the wires (e.g., the second portions thereof), and the pitch between two grooves can refer to a thickness of an insulating material between the two grooves, wherein the thickness direction is parallel to the line width direction of the wires (e.g., the second portions thereof).

Figure 4:
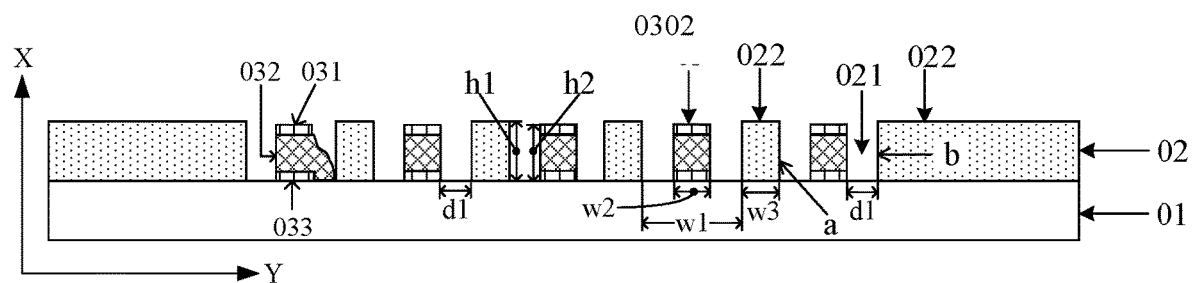
FIG. 4 is a section view of a display substrate according to another embodiment of the present disclosure.

As an optional implementation, as shown in FIG. 4, the insulating layer 02 further comprises a plurality of insulating blocks 022 located in the encapsulation area of the base plate and spaced from each other. Furthermore, each groove 021 can comprise two side walls in no contact with the second portions of the wires (e.g., left and right side walls in the drawing). Referring to FIG. 4, the two side walls can be formed by side walls of two corresponding insulating blocks 022. Correspondingly, each groove 021 can further comprise a bottom wall, wherein the bottom wall can be formed by a portion of an upper surface of the base plate 01. This means that each groove 021 may penetrate through the entire thickness of the insulating layer 02, and the second portion of each wire 03 can be directly formed on the upper surface of the base plate 01 in the encapsulation area.

Figure 5:
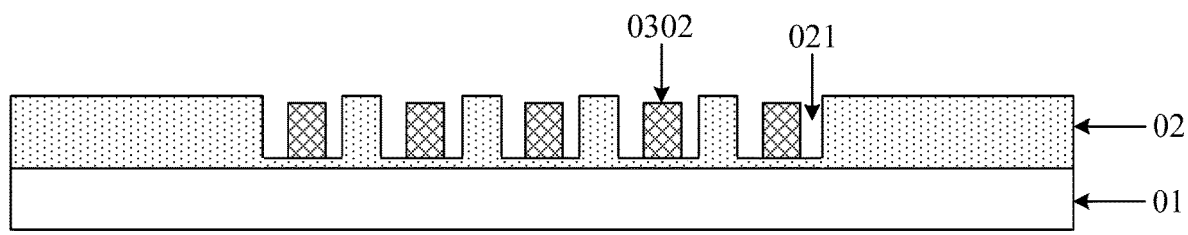
FIG. 5 is a section view of a display substrate according to yet another embodiment of the present disclosure.

As another optional implementation, as shown in FIG. 5, each groove 021 may not penetrate through the entire thickness of the insulating layer 02. In other words, the bottom wall of each groove 021 is not formed by a portion of the upper surface of the base plate 01, but instead, also by an insulating material. For example, the insulating material can be a same material for forming the insulating layer 02. In this case, furthermore, the second portion of each wire 03 located in the encapsulation area can be arranged within a corresponding groove 021 and formed on a side of the insulating material facing away from the base plate 01.

Besides, with a combined reference to FIG. 3 and FIG. 4, it can be seen that an end of each insulating block 022 close to the display area S2 can be connected with a portion of the insulating layer located in the display area S2. That is, each groove 021 of the insulating layer can comprise three side walls connected in sequence, and a side having no side wall (i.e., a side having an opening, e.g., the upper side in FIG. 3) can be provided for allowing connection between the wires and an external chip. As shown in FIG. 4, among the three side walls, side wall a and side wall b arranged opposite to each other are not in contact with the wire (in particular, the second portion thereof). Specifically, the side wall a and the side wall b can be formed by side walls of two adjacent insulating blocks 022 respectively. Besides, side wall c for connecting the side wall a with the side wall b can be formed by a portion of the insulating layer located in the display area S2. Moreover, the side wall c is in contact with the wire (in particular, the second portion thereof), and the wire can go across the side wall c so as to extend from the display area into the groove 021.

Furthermore, as shown in FIG. 4, a depth h1 of each groove 021 can be greater than a thickness h2 of a corresponding wire 03 (in particular, the second portion thereof). In this way, when the second portion 0302 of the wire 03 arranged in a certain groove is melted at a high temperature, the melting liquid will not flow into an adjacent groove, which achieves an effective isolation between adjacent wires. Specifically, a depth direction of the groove 021 and a thickness direction of the wire 03 (in particular, the second portion 0302 thereof) can be both perpendicular to an extension plane of the base plate 01. For example, the depth direction of the groove can be the X direction as shown in FIG. 4.

Optionally, a width w1 of each groove 021 can be greater than a line width w2 of the second portion 0302 of a corresponding wire 03. Thereby, it can be ensured that the second portion of each wire can be completely formed within the corresponding groove during formation of the wires. Furthermore, this can facilitate an effective isolation between the adjacent wires by means of grooves. Specifically, as shown in FIG. 4, a width direction Y of the groove can be parallel to the line width direction of the wire (in particular, the second portion thereof).

Furthermore, with continued reference to FIG. 4, each groove 021 can comprise two side walls that are in no contact with the second portion 0302 of the wire 03 (e.g., the side wall a and the side wall b), and each side wall in no contact with the second portion 0302 of the wire 03 and the second portion 0302 of the corresponding wire 03 have a pitch dl therebetween in the width direction Y, wherein the pitch dl can be greater than or equal to 1 μm. In other words, there can be a certain gap between the second portion of each wire and side walls of the groove. The gap can be used for storing the liquid resulted from melting of the wire, and thus avoid the liquid from overflowing the groove and flowing into an adjacent groove.

Optionally, in each groove, the pitch dl between the side wall and the second portion of the wire can be positively correlated to the line width of the second portion of the wire. In other words, the wider the line width of the second portion of the wire is, the greater the pitch dl can be. In this way, it can be ensured that the gap between the second portion of the wire and the side wall can effectively store the liquid resulted from melting of the wire, and thus avoid the liquid from overflowing.

Optionally, a width w3 of each insulating block 022 can be greater than or equal to 3 μm. With a wider width w3 of each insulating block 022, the insulating block can be prevented from being penetrated by the melted wire, thus ensuring a good isolation effect brought by the insulating block. Specifically, the width direction Y of the insulating block 022 can be parallel to the width direction of the groove 021, or in other words, to the width direction of the second portion 0302 of the wire 03.

Furthermore, as shown in FIG. 4, the second portion 0302 of each wire 03 can comprise a plurality of conductive layers stacked over each other. Specifically, among the plurality of conductive layers, two adjacent conductive layers can be made of different conductive materials.

Exemplarily, in the structure as shown by FIG. 4, the second portion 0302 of each wire 03 can comprise three conductive layers 031, 032 and 033 stacked over each other, wherein the conductive layers 031 and 033 can be made of metal titanium, while the conductive layer 032 can be made of metal aluminum. Besides, among the three conductive layers, the conductive layer 033 can have a thickness of 300 Å, the conductive layer 032 can have a thickness of 5000 Å, and the conductive layer 031 can have a thickness of 500 Å. Accordingly, the second portion 0302 of each wire 03 can have a total thickness h2 of 5800 Å. Correspondingly, the depth h1 of each groove 021 can be greater than 5800 Å.

To sum up, embodiments of the present disclosure provide a display substrate. In the display substrate, the insulating layer comprises at least one groove located in the encapsulation area, and at least one wire comprises a second portion located within a corresponding groove of the encapsulation area. Thereby, adjacent wires (in particular, the second portions thereof) can be isolated from each other by means of grooves. In this case, even if a certain wire (in particular, the second portion thereof) located in a groove is melted due to high temperature during encapsulation, it will not cause short circuits with other adjacent wires, which effectively reduces the probability of display defects.

Figure 6:
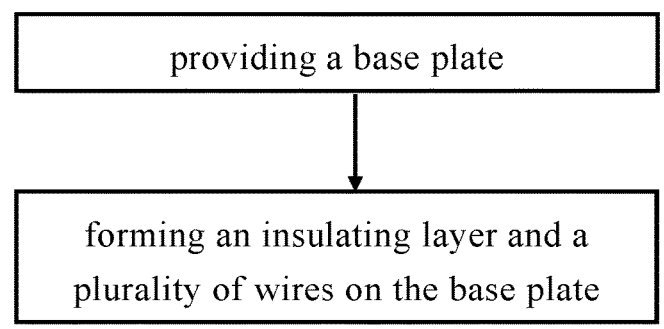
FIG. 6 is a flow chart of a manufacturing method for a display substrate according to an embodiment of the present disclosure.

FIG. 6 is a flow chart of a manufacturing method for a display substrate according to an embodiment of the present disclosure. The method can be used for manufacturing the display substrate as provided in any of the above embodiments. Referring to FIG. 6, the method can comprise steps as follows.

Step 101, providing a base plate.

Specifically, the base plate comprises a display area and an encapsulation area surrounding the display area.

Step 102, forming an insulating layer and a plurality of wires on the base plate.

Specifically, the insulating layer is formed to comprise at least one groove located in the encapsulation area; at least one of the plurality of wires is formed to comprise a first portion located in the display area and a second portion located within a corresponding groove of the encapsulation area; and there is only one said second portion formed in each groove.

Figure 7:
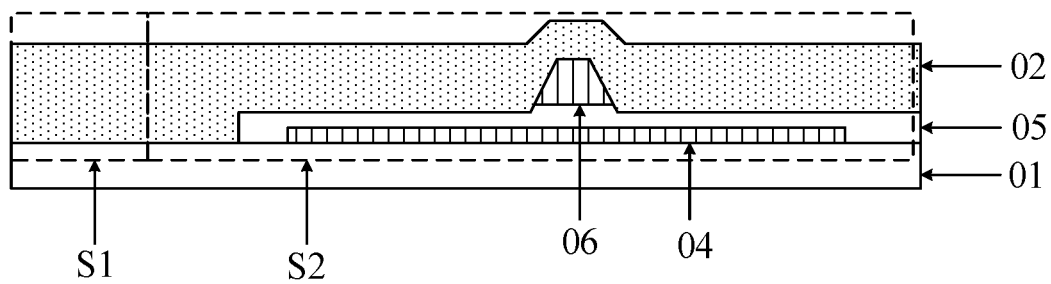
FIG. 7 is a schematic view of an insulating layer formed on a base plate according to an embodiment of the present disclosure.

In an embodiment of the present disclosure, the insulating layer can be an interlayer dielectric (ILD) layer. As shown in FIG. 7, prior to forming the interlayer dielectric layer 02, an active layer 04, a gate insulating layer 05 and a gate electrode 06 have been formed in the display area S2 of the base plate 01. The interlayer dielectric layer 02 can completely cover a surface of the base plate 01, i.e., cover the encapsulation area S1 and the display area S2.

In an embodiment of the present disclosure, an insulating material film can be formed first, and then a portion of the insulating material film located in the encapsulation area of the base plate is patterned to form the at least one groove.

Optionally, the number of grooves to be formed can be chosen based on the number of wires having a lower melting point and a higher risk of melting short circuit among the plurality of wires. Besides, the position where each groove is formed can also be chosen based on the specific position of the second portion of each wire having a lower melting point in the encapsulation area.

Alternatively, a plurality of grooves corresponding to the plurality of wires in a one-to-one manner can also be formed in a portion of the insulating material film located in the encapsulation area. In other words, the number of grooves can be chosen based on the number of wires in the display substrate that need to pass through the encapsulation area and connect with the external chip. Besides, the position where each groove is formed can also be chosen based on the specific position of the second portion of each wire in the encapsulation area.

Furthermore, a conductive film layer can be deposited on the base plate on which the insulating layer (comprising grooves in the encapsulation area) has been formed, and the conductive film layer is patterned to form a plurality of wires. Among the plurality of wires, at least one wire can comprise a second portion located within a corresponding groove. As an example, the at least one wire can be a wire having a lower melting point and a higher risk of melting short circuit among the plurality of wires.

To sum up, embodiments of the present disclosure provide a manufacturing method for a display substrate. With this manufacturing method, the insulating layer comprises at least one groove located in the encapsulation area, and at least one wire comprises a second portion located within a corresponding groove of the encapsulation area. In this way, adjacent wires (in particular, the second portions thereof) can be isolated from each other by means of grooves. In this case, even if a certain wire (in particular, the second portion thereof) located in a groove is melted due to high temperature during encapsulation, it will not cause short circuits with other adjacent wires, which effectively reduces the probability of display defects.

Optionally, in the above manufacturing method, a plurality of grooves corresponding to the plurality of wires in a one-to-one manner can also be formed in a portion of the insulating material film located in the encapsulation area. In this way, among the plurality of wires 03 as formed, each wire 03 comprises a second portion located within a corresponding groove of the encapsulation area. Thereby, an effective isolation between wires can be achieved and the risk of short circuits between wires can be further reduced.

Optionally, as shown in FIG. 7, the insulating layer 02 can be an interlayer dielectric layer. In this case, the manufacturing method can further comprise the step of: forming a contact via hole by using a contact hole mask in a portion of the interlayer dielectric layer located in the display area of the base plate.

During forming a drive transistor in the display substrate, a contact via hole 023 needs to be formed in the interlayer dielectric layer 02 by means of a contact hole mask. The contact via hole 023 can penetrate through the interlayer dielectric layer 02 and the gate insulating layer 05, so as to connect an active layer 04 and a source-drain electrode in the drive transistor.

Figure 8:
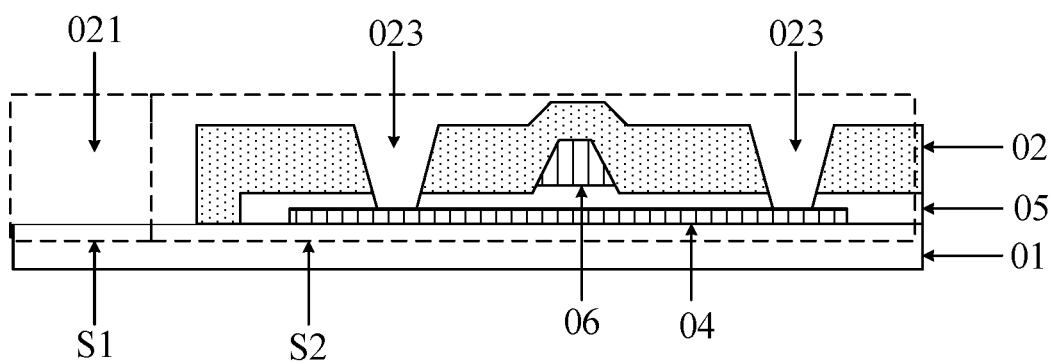
FIG. 8 is a schematic view of a groove formed in an insulating layer according to an embodiment of the present disclosure.

In an embodiment of the present disclosure, referring to FIG. 8, when the contact via hole 023 is formed by means of a contact hole mask in a portion of the interlayer dielectric layer 02 located in the display area S2, at least one groove 021 can be formed synchronously in a portion of the interlayer dielectric layer 02 in the encapsulation area S1 (only one groove is shown in FIG. 8). Furthermore, in connection with FIG. 3, it can be seen that each groove can comprise three side walls. Among the three side walls, side wall a and side wall b arranged opposite to each other in the encapsulation area S1 can be formed by side walls of two adjacent insulating blocks respectively, and side wall c located in the display area S2 can be formed by a portion of the insulating layer located in the display area S2. Besides, the bottom wall of the groove 021 can be a surface portion of the base plate 01.

The at least one groove is formed synchronously during formation of a contact hole by using a contact hole mask in the display area S2, which avoids any increase in the manufacturing steps for the display substrate and thereby reduces the manufacturing cost.

Correspondingly, the manufacturing method for a display substrate can further comprise the step of: continuing to form a source-drain electrode and a plurality of wires on the base plate on which the insulating layer has been formed.

In an embodiment of the present disclosure, a conductive film layer can be formed on the base plate 01 on which the interlayer dielectric layer 02 is formed, and then the conductive film layer is patterned by using a mask so as to obtain a source-drain electrode and a plurality of wires. The second portion of at least one of the plurality of wires located in the encapsulation area can be formed within a corresponding groove.

Figure 9:
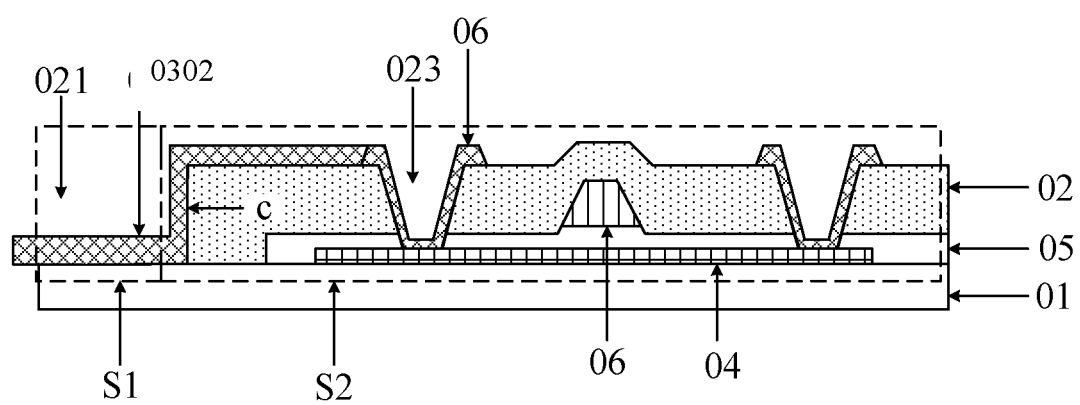
FIG. 9 is a schematic view of wires formed on a base plate according to an embodiment of the present disclosure.

Exemplarily, FIG. 9 is a section view taken along the direction BB in FIG. 3 according to an embodiment of the present disclosure. As shown in FIG. 9, the source-drain electrode 06 located in the display area S2 can be connected with the active layer 05 through the contact via hole 023, and the wire 03 can be connected with the source-drain electrode 06. Besides, the second portion of the wire 03 located in the encapsulation area S1 is formed within the groove 021. As can be seen from FIG. 9, the wire 03 can go across the side wall c and extend from the display area S2 into the groove 021.

Optionally, the conductive film layer formed during the above procedure can comprise a plurality of conductive layers. Among the plurality of conductive layers, two adjacent conductive layers can be made of different conductive materials. For example, the conductive film layer can comprise three conductive layers stacked over each other, wherein the three conductive layers can be sequentially made of metal titanium, metal aluminum and metal titanium.

Optionally, during the above procedure for forming the grooves, a width of each groove is required to be greater than a line width of the second portion of a corresponding wire, and a depth of each groove is required to be greater than a thickness of the second portion of a corresponding wire, so as to ensure an effective isolation between adjacent wires by the grooves.

It should be noted that the patterning process as applied in the above manufacturing method can specifically comprise steps such as photoresist coating, exposing, developing, etching and photoresist stripping.

It should be further noted that in an embodiment of the present disclosure, the type of insulating layer may vary with the structure of drive transistor as formed in the display substrate. For example, the insulating layer can also be a gate insulating layer for isolating a gate electrode from an active layer, which is not limited in embodiments of the present disclosure.

It should be further noted that in an embodiment of the present disclosure, the execution sequence of steps in the manufacturing method for a display substrate can be suitably adjusted. Moreover, the steps can be increased or decreased correspondingly upon actual requirements. For example, a step can be executed before, after or simultaneously with another step. Specifically, as an example, the wires can be formed before the grooves. Any variation easily conceivable within the technical scope disclosed in the present application for a skilled person, who is familiar with this technical field, shall fall within the protection scope of the present application, which will not be repeated herein for simplicity.

To sum up, embodiments of the present disclosure provide a manufacturing method for a display substrate. With this manufacturing method, the insulating layer can comprise at least one groove located in the encapsulation area, and at least one wire comprises a second portion located within a corresponding groove of the encapsulation area. In this way, adjacent wires can be isolated from each other by means of grooves. In this case, even if a certain wire (in particular, the second portion thereof) located in a groove is melted due to high temperature during encapsulation, it will not cause short circuits with other adjacent wires, which effectively reduces the probability of display defects.

According to an embodiment of the present disclosure, an encapsulation method for a display panel is further provided. The encapsulation method can comprise steps as follows.

Step S1, providing a display substrate.

Specifically, the display substrate can be the display substrate as described in any of the above embodiments.

Step S2, providing an encapsulation cover plate.

Specifically, the encapsulation cover plate comprises an encapsulation area corresponding to the encapsulation area of the display substrate.

Step S3, forming an encapsulation sealant in the encapsulation area of the encapsulation cover plate.

As an example, the encapsulation sealant can be glass frit. When the encapsulation cover plate is placed onto the display substrate, an orthogonal projection of the encapsulation area of the encapsulation cover plate on the base plate of the display substrate coincides with the encapsulation area of the base plate.

Step S4, aligning the display substrate onto the encapsulation cover plate with the two encapsulation areas flush with each other.

In embodiments of the present disclosure, a side of the display substrate on which film layers are formed can be arranged to face the encapsulation cover plate, and the display substrate is aligned onto the encapsulation cover plate such that the film layers on the display substrate is brought into contact with the encapsulation sealant on the encapsulation cover plate.

Step S5, irradiating the encapsulation sealant with laser to complete encapsulation.

Figure 10:
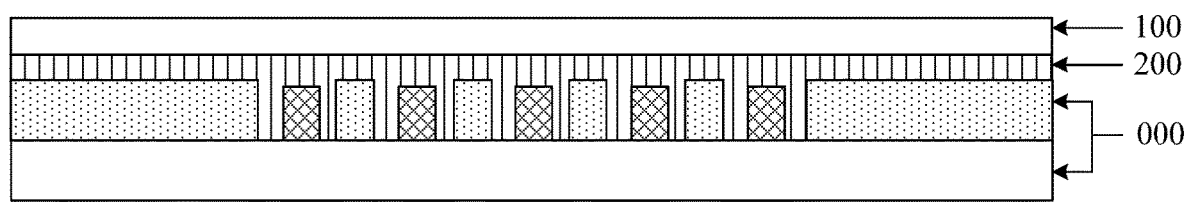
FIG. 10 is a schematic structure view of a display panel according to an embodiment of the present disclosure.

Furthermore, the encapsulation sealant is irradiated by laser such that the encapsulation sealant is sintered at a high temperature, thereby sealing the display substrate and the display cover plate together. The display panel that is formed after sealing between the display substrate and the display cover plate is shown in FIG. 10.

During sintering of the encapsulation sealant, since the second portion of each wire located in the encapsulation area is disposed within a groove of the insulating layer, even if a certain wire is melted due to the high temperature, the melted wire will not be in contact with an adjacent wire. In this way, short circuits between adjacent wires and display defects caused thereby can be avoided effectively.

Embodiments of the present disclosure further provide a display panel. Referring to FIG. 10, the display panel can comprise an encapsulation cover plate 100 and a display substrate 000. Specifically, the display substrate 000 can be the display substrate as shown in any of FIGS. 2-5 and 9. Referring to FIG. 10, it can be seen that the display substrate 000 can be sealed onto the encapsulation cover plate 100 via an encapsulation sealant 200.

Embodiments of the present disclosure further provide a display device. The display device can comprise the display panel as shown in FIG. 10. The display device can be any product or component having a display function, such as a liquid crystal display panel, electronic paper, an OLED panel, an AMOLED panel, a cellphone, a tablet computer, a television, a display, a notebook computer, a digital photo frame, a navigator or the like.

The above description is only preferred embodiments of the present disclosure and cannot limit the present disclosure. Any amendment, equivalent replacement, and improvement made within the spirit and principle of the present disclosure should fall within the protection scope of the present disclosure.

The invention claimed is:

1. A display substrate, comprising:
 a base plate comprising a display area and an encapsulation area around the display area;
 an insulating layer on the base plate; and
 a plurality of wires on the base plate,
 wherein the insulating layer comprises at least one groove in the encapsulation area,
 wherein at least one of the plurality of wires comprises a first portion in the display area and a second portion within the at least one groove of the encapsulation area; and
 wherein there is one second portion within each of the at least one groove.

2. The display substrate according to claim 1,
 wherein, each of the plurality of wires comprises a first portion in the display area and a second portion within the at least one groove of the encapsulation area.

3. The display substrate according to claim 1,
 wherein, a width of each groove of the at least one groove increases as a line width of the second portion of a corresponding wire increases,
 wherein a pitch between adjacent grooves of the at least one groove increases as a pitch between the second portions of corresponding wires increases, and
 wherein a width direction of each groove is parallel to a line width direction of the second portion of the corresponding wire.

4. The display substrate according to claim 2,
 wherein, the insulating layer comprises at least one insulating block in the encapsulation area, and
 wherein each insulation block of the at least one insulating block is between adjacent grooves.

5. The display substrate according to claim 1, wherein, each groove comprises:
 a bottom wall close to the base plate; and
 two side walls intersecting with the bottom wall and not in contact with the second portion of a corresponding wire.

6. The display substrate according to claim 5,
 wherein each of the at least one groove at least partially penetrates through the insulating layer.

7. The display substrate according to claim 1,
 wherein, a depth of each groove is greater than a thickness of the second portion of a corresponding wire,
 wherein a depth direction of the groove and a thickness direction of the second portion of the corresponding wire are both perpendicular to an extension plane of the base plate.

8. The display substrate according to claim 1,
 wherein, a width of each groove is greater than a line width of the second portion of a corresponding wire,
 wherein a width direction of the groove is parallel to a line width direction of the second portion of the corresponding wire.

9. The display substrate according to claim 8,
wherein, each groove comprises two side walls not in contact with the second portion of a corresponding wire, and
wherein each side wall is spaced apart from the second portion of the corresponding wire by a pitch greater than or equal to 1 μm in a width direction of the groove.

10. The display substrate according to claim 4,
wherein, a width of each insulating block is greater than or equal to 3 μm, and
wherein a width direction of each insulating block is parallel to a width direction of the groove.

11. The display substrate according to claim 1,
wherein, at least the second portion of each wire comprises a plurality of conductive layers stacked over each other, and
wherein adjacent conductive layers comprise different conductive materials.

12. A manufacturing method for a display substrate, comprising:
providing a base plate, the base plate comprising a display area and an encapsulation area around the display area; and
forming an insulating layer and a plurality of wires on the base plate,
wherein, the insulating layer is formed to comprise at least one groove in the encapsulation area,
wherein at least one of the plurality of wires is formed to comprise a first portion in the display area and a second portion within a corresponding groove of the encapsulation area, and
wherein there is only one said second portion formed in each groove.

13. The method according to claim 12,
wherein, each of the plurality of wires is formed to comprise a first portion in the display area and a second portion within a corresponding groove of the encapsulation area.

14. The method according to claim 12, wherein, the insulating layer comprises an interlayer dielectric layer, and wherein the method further comprises:
forming an active layer on a side of the interlayer dielectric layer close to the base plate and in the display area of the base plate;
forming a contact via hole by using a contact hole mask in a portion of the interlayer dielectric layer located in the display area of the base plate; and
forming a source-drain electrode on the base plate on which the interlayer dielectric layer has been formed.

15. An encapsulation method for a display panel, comprising:
providing the display substrate according to claim 1, wherein the encapsulation area comprises a first encapsulation area;
providing an encapsulation cover plate, the encapsulation cover plate comprising a second encapsulation area corresponding to the first encapsulation area of the display substrate;
forming an encapsulation sealant in the second encapsulation area of the encapsulation cover plate;
aligning the display substrate onto the encapsulation cover plate with the first and second encapsulation areas flush with each other; and
irradiating the encapsulation sealant with a laser to complete encapsulation.

16. A display panel, comprising:
an encapsulation cover plate; and
the display substrate according to claim 1,
wherein, the display substrate and the encapsulation cover plate are sealed together by an encapsulation sealant.

17. The display substrate according to claim 5,
wherein, each of the at least one groove completely penetrates through the insulating layer.

18. The display substrate according to claim 2,
wherein, a depth of each groove is greater than a thickness of the second portion of a corresponding wire, and
wherein a depth direction of the groove and a thickness direction of the second portion of the corresponding wire are both perpendicular to an extension plane of the base plate.

19. The display substrate according to claim 5,
wherein, a depth of each groove is greater than a thickness of the second portion of a corresponding wire, and
wherein a depth direction of the groove and a thickness direction of the second portion of the corresponding wire are both perpendicular to an extension plane of the base plate.

20. The display substrate according to claim 2,
wherein, a width of each groove is greater than a line width of the second portion of a corresponding wire, and
wherein a width direction of the groove is parallel to a line width direction of the second portion of the corresponding wire.

* * * * *